US007289637B2

(12) United States Patent
Montag et al.

(10) Patent No.: US 7,289,637 B2

(45) Date of Patent: Oct. 30, 2007

(54) METHOD FOR AUTOMATICALLY ADJUSTING THE FILTER PARAMETERS OF A DIGITAL EQUALIZER AND REPRODUCTION DEVICE FOR AUDIO SIGNALS FOR IMPLEMENTING SUCH A METHOD

(75) Inventors: Christoph Montag, Hildesheim (DE); Juergen Wermuth, Peine (DE); Udo Klaas, Sehnde (DE)

(73) Assignee: Robert Bosch GmbH, Stuttgart (DE)

( * ) Notice: Subject to any disclaimer, the term of this patent is extended or adjusted under 35 U.S.C. 154(b) by 465 days.

(21) Appl. No.: 10/467,190

(22) PCT Filed: Nov. 9, 2001

(86) PCT No.: PCT/DE01/04221

§ 371 (c)(1),
(2), (4) Date: Jan. 9, 2004

(87) PCT Pub. No.: WO02/063918

PCT Pub. Date: Aug. 15, 2002

(65) Prior Publication Data

US 2004/0105558 A1 Jun. 3, 2004

(30) Foreign Application Priority Data

Feb. 6, 2001 (DE) ................................ 101 05 184

(51) Int. Cl.
*H03G 5/00* (2006.01)

(52) U.S. Cl. ......................................... 381/103; 381/98

(58) Field of Classification Search ................ 381/103, 381/96, 98, 86, 95

See application file for complete search history.

(56) References Cited

U.S. PATENT DOCUMENTS

| | | | | | |
|---|---|---|---|---|---|
| 4,130,023 | A | * | 12/1978 | Henricksen | 73/647 |
| 4,628,530 | A | * | 12/1986 | Op De Beek et al. | 381/103 |
| 4,688,258 | A | * | 8/1987 | Kunugi et al. | 381/103 |
| 5,506,910 | A | * | 4/1996 | Miller et al. | 381/103 |
| 5,511,129 | A | * | 4/1996 | Craven et al. | 381/103 |
| 5,581,621 | A | * | 12/1996 | Koyama et al. | 381/103 |
| 5,617,480 | A | | 4/1997 | Ballard et al. | |

FOREIGN PATENT DOCUMENTS

| | | |
|---|---|---|
| DE | 41 25 893 | 3/1992 |
| EP | 0 451 620 | 10/1991 |
| FR | 2 478 409 | 9/1981 |

* cited by examiner

*Primary Examiner*—Vivian Chin
*Assistant Examiner*—Jason Kurr
(74) *Attorney, Agent, or Firm*—Kenyon & Kenyon LLP

(57) ABSTRACT

A method is proposed for automatically adjusting the filter parameters—center frequency, quality and amplification or attenuation—of at least one digital equalizer which is a component of a reproduction device for audio signals in a vehicle passenger compartment. To that end, first of all, the acoustical frequency response of the passenger compartment is ascertained. The inadequacies in the acoustics of the passenger compartment in the form of local maxima and minima in the measured frequency response are then determined. On this basis, the filter parameters are adjusted automatically so that at least a portion of these inadequacies is compensated. A reproduction device for audio signals for implementing this method is also proposed.

14 Claims, 1 Drawing Sheet

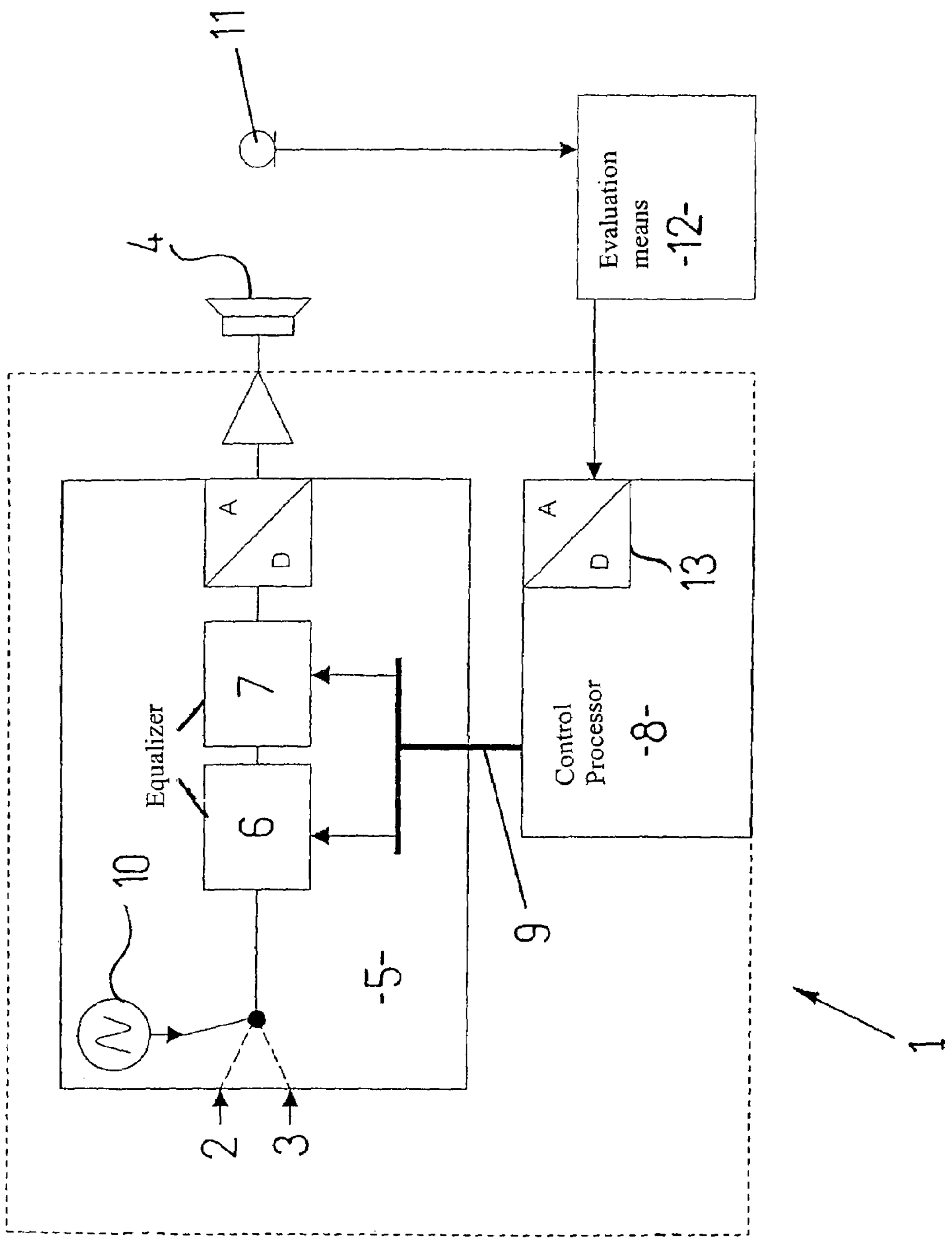
11
Evaluation means
-12-
4
A
D
13
Control Processor
-8-
Equalizer
7
6
10
-5-
9
2
3
1

METHOD FOR AUTOMATICALLY ADJUSTING THE FILTER PARAMETERS OF A DIGITAL EQUALIZER AND REPRODUCTION DEVICE FOR AUDIO SIGNALS FOR IMPLEMENTING SUCH A METHOD

FIELD OF THE INVENTION

The present invention relates to a method for automatically adjusting the filter parameters—center frequency, quality and amplification or attenuation—of at least one digital equalizer which is a component of a reproduction device for audio signals in a vehicle passenger compartment. The invention also relates to a reproduction device for audio signals for implementing such a method, having a loudspeaker device and having an audio processor which includes at least one digital equalizer, is arranged in the signal path between at least one signal source and the loudspeaker device, and is connected to a control processor via a control bus.

BACKGROUND INFORMATION

Certain car radio devices, known from practice, are based on the so-called 2-IC technology. In these car radio devices, two or three freely programmable audio filters are integrated into the signal path. These digital parametric equalizers (DPE) are available to the user to compensate for acoustical shortcomings in the passenger compartment. The user is able to vary each filter with respect to center frequency, quality, i.e. filter width, and amplification or attenuation, in order to compensate for excessive rises and so-called holes in the acoustical frequency response of the passenger compartment.

However, this proves to be problematic in practice, since the user must know the acoustics of his/her vehicle very well to optimally adjust the equalizers, and it is very difficult to ascertain the acoustical frequency response solely by listening, without metrological aid. The operating instructions of the known car radio devices are only able to provide very limited assistance for the best possible adjustment of the equalizers, since on no account is it possible to consider all types of vehicles here, and by no means the great number of individual layout variants, as well as loudspeaker and amplifier configurations.

Moreover, car radio devices are known having an audio module, integrated in the signal path, on which a graphic equalizer is implemented with the aid of a digital signal processor. The seven or nine bands of such a graphic equalizer are fixed in their center frequency and quality, and are only variable in their amplification. The separate audio module of these car radio devices permits an automatic calibration of the graphic equalizer. To that end, the acoustics in the passenger compartment are measured with the aid of a microphone connected to the audio module via an analog-to-digital converter. Using a special software, the graphic equalizer is subsequently adjusted in such a way that the inadequacies of the acoustics are compensated for in the best way possible.

The use of a graphic equalizer to compensate for the inadequacies in the acoustics of a passenger compartment proves to be problematic in practice. As already mentioned, the center frequencies of the equalizer bands of a graphic equalizer are fixed. As a rule, they are spaced apart by a minimum of one octave in the case of nine bands. Thus, it is not possible to optimally compensate for narrow resonance rises, which lie between the equalizer bands, in the acoustical frequency response of the passenger compartment. Moreover, the additional audio module having the digital signal processor for implementing the graphic equalizer and for calibrating this equalizer is relatively cost-intensive.

SUMMARY OF THE INVENTION

With the present invention, it is now proposed to adjust the filter parameters—center frequency, quality and amplification or attenuation—of the digital equalizer(s) automatically, in order to relieve the user of the difficult task of adapting the digital equalizer(s) to the special acoustics of his/her vehicle passenger compartment.

This is achieved according to the present invention by a method for automatically adjusting the filter parameters, in which first of all, the acoustical frequency response of the passenger compartment is ascertained, then the shortcomings in the acoustics of the passenger compartment in the form of local maxima and minima in the frequency response are determined, and thereupon the filter parameters are adjusted automatically so that at least a portion of these shortcomings is compensated for.

Moreover, a reproduction device of the type indicated at the outset is proposed which, according to the present invention, to automatically adjust the digital equalizer(s), includes a noise generator, via which a noise signal may be supplied to the equalizer. In addition, the control processor includes means, via which the filter parameters are adjustable so that the equalizer has a bandpass characteristic with a narrow bandwidth, the center frequency being variable over the audio spectrum. To capture the signal emitted by the loudspeaker device into the passenger compartment and to determine the frequency response, at least one microphone having evaluation means is provided. Finally, the control processor also includes means via which the filter parameters are adjustable, taking into account the measured frequency response.

According to the present invention, it has become known that an automatic adjustment of the filter parameters of the digital equalizers of a reproduction device for audio signals in a passenger compartment is useful, since when optimizing the filter parameters, it is necessary to consider the individual acoustical properties of the passenger compartment, arranged and equipped specific to the user, and these properties may be detected best using metrological means. By varying not only the amplification and attenuation, respectively, of the equalizers, but also the center frequencies and qualities, it is possible to compensate for the shortcomings in the acoustics of the passenger compartment very well, regardless of the position and the width of the excessive rises and holes in the measured frequency response.

Furthermore, it has become known according to the present invention that the equalizers to be calibrated, because of their programmability, may be used first of all for determining the acoustical frequency response of the passenger compartment before the filter parameters are adjusted to compensate for the inadequacies in the measured frequency response. It has also become known that the filter parameters may be optimized with the aid of a suitable additional software of the control processor, present anyway, of the car radio device. Thus, all in all, no additional audio module having a digital signal processor is necessary within the framework of the present invention, but rather only a microphone amplification and rectification circuit which is coupled to the analog-to-digital converter present in the control processor. In this manner, only a very small additional outlay for hardware and software, and therefore costs, is necessary for the automatic adjustment of the filter parameters proposed in the present invention.

In principle, there are various possibilities for determining the acoustical frequency response of the vehicle passenger compartment within the framework of the method according to the present invention. In one advantageous variant, the loudspeaker device of the reproduction device is triggered in succession by bandpass noise signals having different center frequencies. The frequency bands, set in each case in the form of a bandpass noise signal, cover the entire audio spectrum. The frequency response to be determined is now ascertained in the form of frequency measuring points for the individual frequency bands. The sound level of the signal which, in this case, is emitted by the loudspeaker device into the passenger compartment, may simply be determined as a frequency measuring point for a specific frequency band.

In view of minimizing the hardware and software expenditure, it proves to be advantageous to generate the bandpass noise signals for ascertaining the acoustical frequency response of the passenger compartment using the equalizer to be adjusted itself. Since both the center frequency and the quality of the equalizer are freely programmable, the filter parameters may be adjusted so that a bandpass characteristic having a narrow bandwidth at a predefined center frequency results for the equalizer. From a noise signal supplied to it, the equalizer then generates the desired bandpass noise signal or a succession of bandpass noise signals which cover the entire audio spectrum.

In principle, there are also various possibilities within the framework of the method of the present invention for the automatic determination and adjustment of the filter parameters. In one advantageous variant, a plurality of normalized equalizer curve patterns of different quality are stored for this purpose. To determine the filter parameters, for each curve pattern and each local maximum determined in the measured frequency response, the center frequency of the curve pattern is now shifted to the local maximum, and an attenuation is determined by scaling the curve pattern to the level of this local maximum. The filter corresponding to this scaled curve pattern is then used on the measured frequency response, and the deviation of the resulting frequency response from a target frequency response is determined. In this way, for each potential center frequency of the equalizer, as many error values for the deviation from the target frequency response are determined as there are curve patterns or qualities stored. The filter parameters—center frequency, attenuation and quality—of that curve pattern for which the smallest error value has been determined are finally taken as the basis for the automatic adjustment of the equalizer.

In view of the different perception of resonances and holes in the frequency response, as well as the general dependence of the perception on the frequency of the audio signal, it is advantageous to weight the individual deviations when determining the deviation of a filtered frequency response from the target frequency response. In so doing, it proves to be useful to weight positive individual deviations more strongly than negative individual deviations, so that any remaining excessive rises in the frequency response are evaluated as worse than the holes which are far more uncritical psychoacoustically. Alternatively or in addition thereto, psychoacoustically critical frequency ranges may be weighted more strongly than psychoacoustically uncritical frequency ranges.

Moreover, it is advantageous if, when determining the deviation of a filtered frequency response from the target frequency response, the level of the local maximum or the resonance corresponding to it is taken into account, so that narrow, high resonances lead to a smaller error value compared to wider, less high resonances, and therefore are preferably eliminated.

If the filter parameters of a plurality of digital equalizers must be adjusted automatically, it is advantageous to determine the filter parameters of the individual equalizers in succession, in that in each case, prior to determining the filter parameters of one equalizer, the equalizer(s) adjusted before are used on the measured frequency response.

BRIEF DESCRIPTION OF THE DRAWING

The FIGURE shows the block diagram of a reproduction device for audio signals for implementing the method of the present invention.

DETAILED DESCRIPTION

Reproduction device 1 shown in the FIGURE is used for reproducing audio signals in a vehicle passenger compartment; the audio signals may be generated by different audio sources 2, 3, such as radio, CD, CC, etc. Reproduction device 1 includes a loudspeaker device 4 and an audio processor 5 that is arranged in the signal path between audio sources 2, 3 and loudspeaker 4 and that has two freely adjustable digital equalizers 6, 7, via which the signals from different audio sources 2, 3 are fed to loudspeaker device 4. Of course, more than two equalizers may also be provided here. To adjust the filter parameters—center frequency, quality and amplification or attenuation—a control processor 8 sends suitable filter parameters via a control bus 9 to audio processor 5.

To determine the frequency response of the passenger compartment, reproduction device 1 also includes a noise generator 10, via which a noise signal may be supplied to equalizers 6, 7. Noise generator 10 is implemented here as additional software in audio processor 5, and, if necessary, may be started via control processor 8. Alternatively, the noise signal could also be generated by an external noise source as additional audio source, for example, with the aid of an appropriate CD or a suitably adjusted tuner.

Control processor 8 also includes means via which the filter parameters may be adjusted in such a way that equalizers 6, 7 have a bandpass characteristic with a narrow bandwidth, i.e. with a quality on the order of magnitude of 8, the center frequency being variable over the audio spectrum. In this way, with the aid of noise generator 10 and via equalizers 6, 7, loudspeaker device 4 may be triggered by a bandpass noise signal.

When the calibration of equalizers 6, 7 has been started, for example, by a keystroke, control processor 8 varies the filter parameters in defined time sequence, so that the center frequency of the bandpass filter decreases, for example, in the one-third-octave interval from the highest to the lowest frequency to be adjusted. The signals, which are then emitted in each case via loudspeaker device 4 into the passenger compartment, are detected with the aid of a microphone 11 and evaluated by suitable evaluation means 12 for determining the frequency response of the passenger compartment. To that end, the signals sensed by microphone 11 are amplified in an operational amplifier circuit, subjected to a logarithmic procedure and rectified, so that a direct voltage is present at the output of this circuit. The magnitude of this direct voltage is proportional to the sound level or sound pressure in the passenger compartment for the frequency band, which is adjusted by the respective bandpass noise signal. The sound level for the entire audio spectrum is detected by the tuning of equalizers 6, 7.

The direct voltage representing the sound level is sampled by an analog-to-digital converter 13 of control processor 8, so that after the tuning of all frequencies or frequency bands to be measured with the corresponding voltage values, a precise image of the acoustical frequency response of the passenger compartment is available to control processor 8. The absolute frequency response value or amplitude response, and not the phase response, is designated exclusively here as the frequency response.

Control processor 8 now ascertains the inadequacies, i.e. the resonances and holes, in the acoustics of the passenger compartment in the form of local maxima and minima in the measured frequency response, and determines the filter parameters—center frequency, amplification and quality—of equalizers 6, 7, so that these inadequacies are compensated for as well as possible.

The total additional expenditure compared to a car radio device whose equalizers are not adjustable automatically is in an additional hardware 10 or additional software for generating a noise signal, an additional software in control processor 8 which takes over the sequencing control of the calibration process as well as the ascertainment of the best filter parameter setting, and an additional hardware 12 for the amplification, logarithmation and rectification of the microphone signal.

To ascertain the best possible setting of the filter parameters, normalized equalizer curve patterns having different quality are stored in audio processor 5.

In one advantageous variant of the method according to the present invention, first of all the resonances, i.e. the local maxima, in the frequency response, measured and adjusted by the frequency response of the microphone, are determined. For each curve pattern and each of these local maxima, the following work steps are then carried out:

The center frequency of the curve pattern is shifted to the local maximum and scaled using the level of the resonance, i.e. the level of the maximum. The frequency response resulting therefrom is subtracted from the measured frequency response, which corresponds to the use of a filter having the properties of the shifted and scaled curve pattern on the measured frequency response.

The deviation of the resulting frequency response from a predefined target frequency response is then ascertained. As a rule, the target frequency response is linear, but a raising or lowering of certain frequency ranges may also be provided. The deviation is ascertained by weighted summation of the amounts of the individual deviations at the frequency points, and is a measure for how good the equalization is for the individual shifted and scaled curve patterns. The greater the value of the deviation, the poorer the equalizing. Positive deviations are weighted double compared to negative deviations, so that any remaining excessive rises in the frequency response are evaluated as worse than the psychoacoustically far less critical holes. A different weighting of individual frequency ranges is also conceivable here, since resonances in certain frequency ranges are more critical than in others. The result of this weighted summation corresponds in principle to the "area" between the target curve and the real curve, the portion above the target curve being evaluated double. An error value now exists for each curve pattern, i.e. for each quality, and for each local maximum in the measured frequency response.

The level of the respective resonance, i.e. of the corresponding maximum, is also subtracted from this error value. Smaller error values are thereby allocated to narrow high resonances, than to wide, less high resonances having the same "error area". The former are thus preferably eliminated, which is useful from the psychoacoustical standpoint.

For each potential equalizer center frequency, as many error values now exist as there are curve patterns or qualities stored. The parameters—amplification or scaling, center frequency and quality—of the shifted and scaled curve pattern for which the smallest error value has been determined are now selected as filter parameters.

The frequency response determined in this way for the first equalizer is added to the measured frequency response. These same work steps are then carried out for ascertaining the filter parameters of the second equalizer; here then, the measured frequency response of the passenger compartment is not taken as a basis, but rather the frequency response of the passenger compartment filtered by the first equalizer.

What is claimed is:

1. A method for automatically adjusting at least one filter parameter of at least one digital equalizer that is a component of a reproduction device for an audio signal in a vehicle passenger compartment, comprising:

ascertaining an acoustical frequency response of the vehicle passenger compartment;

determining an inadequacy in an acoustics of the vehicle passenger compartment in the form of one of a local maxima and a local minima in the acoustical frequency response;

automatically adjusting the at least one filter parameter so that at least a portion of the inadequacy is compensated for; and storing a plurality of normalized curve patterns of different quality for the automatic adjustment of the at least one filter parameter, wherein:

each determined local maximum in the acoustical frequency response is a potential center frequency of the at least one digital equalizer;

for each determined local maximum in the acoustical frequency response:

for each of the normalized curve patterns:

(a) the center frequency of the respective curve pattern is shifted to the respective local maximum, (b) an attenuation is determined by scaling the respective curve pattern to the level of the respective local maximum, (c) the filter corresponding to the respective scaled curve pattern is used on the acoustical frequency response to output a filtered frequency response, and (d) a deviation of the filtered frequency response from a target frequency response is determined, the deviation representing a corresponding error value; and the performance of (a)-(d) for each of the plurality of curve patterns results in as many error values for the respective potential center frequency as there are curve patterns stored; and those of the at least one filter parameter of a particular one of the shifted and scaled curve patterns that has led to a smallest one of the error values are taken as the basis for the automatic adjustment of the at least one digital equalizer.

2. The method as recited in claim 1, wherein:

the at least one filter parameter includes a center frequency, a quality, and one of an amplification and an attenuation.

3. The method as recited in claim 1, wherein:

the acoustical frequency response of the vehicle passenger compartment is ascertained by:

triggering a loudspeaker device of the reproduction device in succession by bandpass noise signals having different center frequencies, wherein frequency bands, adjusted in each case in the form of a bandpass noise signal, cover an entire audio spectrum, and ascertaining the acoustical frequency response in the form of frequency measuring points for individual ones of the frequency bands, wherein a sound level of a signal emitted by the loudspeaker device into the vehicle passenger compartment is determined as the frequency measuring point for a specific frequency band.

4. The method as recited in claim 3, further comprising:

generating the bandpass noise signal by operating the at least one digital equalizer, in that a noise signal is supplied to the at least one digital equalizer, and the at least one filter parameter is adjusted so that a bandpass characteristic having a narrow bandwidth at a predefined center frequency results for the at least one digital equalizer.

5. The method as recited in claim 1, further comprising:

for each deviation determination, weighting, for a plurality of frequency points of the respective filtered frequency response, respective individual corresponding deviations from the target frequency response.

6. The method as recited in claim 5, wherein:

a positive individual deviation is weighted more strongly than a negative individual deviation.

7. The method as recited in claim 5, wherein:

some frequency ranges are weighted more strongly than other frequency ranges.

8. The method as recited in claim 1, wherein:

a level of one of the local maximum and a resonance corresponding to the level of the local maximum is taken into account when determining the deviation of a filtered frequency response from the target frequency response, so that resonances which are narrow and high compared to wider, less high resonances are eliminated.

9. The method as recited in claim 1, wherein:

the at least one digital equalizer includes plural digital equalizers, the at least one filter parameter includes plural filter parameters, the filter parameters of at least two digital equalizers are adjusted automatically, and the filter parameters are determined in succession, in that, in each case, prior to determining the filter parameters of one of the digital equalizer, at least one of the equalizer adjusted before are used on the acoustical frequency response.

10. A reproduction device for an audio signal, comprising:

a loudspeaker device;

an audio processor that includes at least one digital equalizer;

a control bus;

at least one microphone including an evaluation device for detecting a signal emitted by the loudspeaker device into a vehicle passenger compartment and for determining a frequency response;

a control processor connected to the audio processor via the a control bus, the control processor including an arrangement for determining an inadequacy in an acoustics of the vehicle passenger compartment and for automatically adjusting at least one filter parameter to compensate at least a portion of the inadequacy, the adjustment taking into account the frequency response;

wherein:

each determined local maximum of the frequency response is a potential center frequency of the at least one digital equalizer;

for each determined local maximum of the frequency response:

the arrangement is configured to, for each of a plurality of stored normalized curve patterns of different quality for the adjustment of the at least one filter parameter:

(a) shift the center frequency of the respective curve pattern to the respective local maximum;

(b) determine an attenuation by scaling the respective curve pattern to the level of the respective local maximum;

(c) use the filter corresponding to the respective scaled curve pattern on the frequency response to output a filtered frequency response; and (d) determine a deviation of the filtered frequency response from a target frequency response, the deviation representing a corresponding error value; and the performance for the respective frequency response of (a)-(d) for each of the plurality of curve patterns results in as many error values for the respective potential center frequency as there are curve patterns stored; and the arrangement is configured to take those of the at least one filter parameter of one of the shifted and scaled curve patterns that has led to a smallest one of the error values as the basis for the automatic adjustment of the at least one digital equalizer.

11. The reproduction device as recited in claim 10, further comprising:

at least one signal source; and a noise generator via which a noise signal can be supplied to the at least one equalizer; wherein:

the audio processor is arranged in a signal path between the at least one signal source and the loudspeaker device;

the arrangement is configured to adjust the at least one filter parameter so that at least one digital equalizer has a bandpass characteristic with a narrow bandwidth; and a center frequency of the at least one equalizer is variable over an audio spectrum.

12. The reproduction device as recited in claim 11, wherein:

the noise generator is implemented in the audio processor.

13. The reproduction device as recited in claim 11, wherein:

the noise generator includes an additional external signal source.

14. The reproduction device as recited in claim 10, wherein:

the evaluation device includes an arrangement for performing an amplification, a logarithmation, and a rectification of the audio signal.

* * * * *